(12) United States Patent
Rajan et al.

(10) Patent No.: US 11,476,340 B2
(45) Date of Patent: Oct. 18, 2022

(54) DIELECTRIC HETEROJUNCTION DEVICE

(71) Applicant: Ohio State Innovation Foundation, Columbus, OH (US)

(72) Inventors: Siddharth Rajan, Columbus, OH (US); Zhanbo Xia, Columbus, OH (US); Wyatt Moore, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 0 days.

(21) Appl. No.: 17/002,253

(22) Filed: Aug. 25, 2020

(65) Prior Publication Data

US 2021/0126094 A1    Apr. 29, 2021

Related U.S. Application Data

(60) Provisional application No. 62/925,902, filed on Oct. 25, 2019.

(51) Int. Cl.
*H01L 29/40* (2006.01)
*H01L 29/872* (2006.01)
(Continued)

(52) U.S. Cl.
CPC .......... *H01L 29/408* (2013.01); *H01L 29/872* (2013.01); *H01L 31/08* (2013.01); *H01L 29/24* (2013.01)

(58) Field of Classification Search
CPC ..... H01L 29/408; H01L 29/872; H01L 29/24; H01L 29/0684; H01L 29/0649; H01L 31/08
See application file for complete search history.

(56) References Cited

U.S. PATENT DOCUMENTS 3,268,744 A * 8/1966 Kaiser .................. H01G 4/1209
307/327
3,365,631 A * 1/1968 Spielberger .............. H01B 3/02
361/321.5

(Continued)

FOREIGN PATENT DOCUMENTS

WO    WO-2018159350 A1 *  9/2018  ....... H01L 29/66969

OTHER PUBLICATIONS

Habib et al. "Spectroscopic Ellipsometry Study of the Dielectric Function of Cu(In1—xGax)3Se5 Bulk Compounds" World Journal of Condensed Matter Physics, 7, 99-110 (Year: 2017).*

(Continued)

*Primary Examiner* — Sitaramarao S Yechuri
(74) *Attorney, Agent, or Firm* — Meunier Carlin & Curfman LLC

(57) ABSTRACT

A device is provided that comprises a first layer deposited onto a second layer. The second layer comprises a lightly doped n-type or p-type semiconductor drift layer, and the first layer comprises a high-k material with a dielectric constant that is at least two times higher than the value of the second layer. A metal Schottky contact is formed on the first layer and a metal ohmic contact is formed on the second layer. Under reverse bias, the dielectric constant discontinuity leads to a very low electric field in the second layer, while the electron barrier created by the first layer stays almost flat. Under forward bias, electrons flow through the first layer, into the metal ohmic contact. For small values of conduction band offset or valence band offset between the first layer and the second layer, the device is expected to support efficient electron or hole transport.

11 Claims, 4 Drawing Sheets

(51) Int. Cl.
*H01L 31/08* (2006.01)
*H01L 29/24* (2006.01)

(56) References Cited

U.S. PATENT DOCUMENTS

| | | | | |
|---|---|---|---|---|
| 4,147,670 | A * | 4/1979 | Shohata | H01C 7/112 252/519.52 |
| 5,512,773 | A * | 4/1996 | Wolf | H01L 29/88 257/471 |
| 2010/0123812 | A1* | 5/2010 | Sekiguchi | H01L 27/14609 348/308 |
| 2011/0309470 | A1* | 12/2011 | Grebs | H01L 29/66143 257/520 |
| 2013/0011963 | A1* | 1/2013 | Lien | C04B 35/453 438/104 |
| 2014/0166107 | A1* | 6/2014 | Lee | H01L 31/0749 136/260 |
| 2015/0129876 | A1* | 5/2015 | Mohammed | H01L 33/18 257/52 |
| 2015/0311352 | A1* | 10/2015 | Yamazaki | H01L 29/78648 257/43 |
| 2019/0058041 | A1* | 2/2019 | Dasgupta | H01L 29/7786 |
| 2019/0148563 | A1* | 5/2019 | Sasaki | H01L 29/36 257/43 |
| 2019/0225754 | A1* | 7/2019 | Nukada | C09D 179/08 |
| 2019/0267498 | A1* | 8/2019 | Cheng | H01L 31/1812 |
| 2019/0287728 | A1* | 9/2019 | Cho | H05K 7/142 |
| 2020/0006412 | A1* | 1/2020 | Li | H01L 27/1218 |
| 2020/0169683 | A1* | 5/2020 | Yamamoto | H01L 29/786 |
| 2021/0273060 | A1* | 9/2021 | Kase | H01L 29/401 |
| 2021/0343880 | A1* | 11/2021 | Arima | H01L 29/24 |

OTHER PUBLICATIONS

Xia, Zhanbo, et al. "Metal/BaTiO3/β-Ga2O3 dielectric heterojunction diode with 5.7 MV/cm breakdown field." Applied Physics Letters 115.25 (2019): 252104.
Razzak, Towhidur, et al. "BaTiO3/Al0. 58Ga0. 42N lateral heterojunction diodes with breakdown field exceeding 8 MV/cm." Applied Physics Letters 116.2 (2020): 023507.
T. Zhang, et. al. "A > 3 kV/2.94 m Ω.cm2 and Low Leakage Current with Low Turn-On Voltage Lateral GaN Schottky Barrier Diode on Silicon Substrate with Anode Engineering Technique", IEEEEDL, vol. 40(10), (2019) p. 1583-1586.
Hanawa, Hideyuki, et al. "Numerical Analysis of Breakdown Voltage Enhancement in AlGaN/GaN HEMTs with a High-k Passivation Layer." IEEE Transactions on Electron Devices 61.3 (2014): 769-775.
Aida, Hideo, et al. "Growth of β-Ga2O3 single crystals by the edge-defined, film fed growth method." Japanese Journal of Applied Physics 47.11R (2008): 8506.
Baliga, B. Jayant. "Semiconductors for high-voltage, vertical channel field-effect transistors." Journal of applied Physics 53.3 (1982): 1759-1764.
Farzana, Esmat, et al. "Influence of metal choice on (010) β-Ga2O3 Schottky diode properties." Applied Physics Letters 110.20 (2017): 202102.
Fowler, Ralph Howard, and Lothar Nordheim. "Electron emission in intense electric fields." Proceedings of the Royal Society of London. Series A, Containing Papers of a Mathematical and Physical Character 119.781 (1928): 173-181.
Frenkel, J. "On pre-breakdown phenomena in insulators and electronic semi-conductors." Physical Review 54.8 (1938): 647.
Galazka, Z., et al. "Czochralski growth and characterization of β-Ga2O3 single crystals." Crystal Research and Technology 45.12 (2010): 1229-1236.
Green, Andrew J., et al. "3.8-MV/cm Breakdown Strength of MOVPE-Grown Sn-Doped β-Ga2O3 MOSFETs." IEEE Electron Device Letters 37.7 (2016): 902-905.
Higashiwaki, Masataka, et al. "Gallium oxide (Ga2O3) metal-semiconductor field-effect transistors on single-crystal β-Ga2O3 (010) substrates." Applied Physics Letters 100.1 (2012): 013504.
Hu, Zongyang, et al. "Enhancement-mode Ga 2 O 3 vertical transistors with breakdown voltage> 1 kV." IEEE Electron Device Letters 39.6 (2018): 869-872.
Joishi, et al., "Breakdown Characteristics of β-(Al0.22Ga0.78)2O3/Ga2O3 Field-Plated Modulation-Doped Field-Effect Transistors" in IEEE Electron Device Letters, vol. 40, No. 8, pp. 1241-1244, Aug. 2019.
Konishi, Keita, et al. "1-kV vertical Ga2O3 field-plated Schottky barrier diodes." Applied Physics Letters 110.10 (2017): 103506.
Krishnamoorthy, Sriram, et al. "Delta-doped β-gallium oxide field-effect transistor." Applied Physics Express 10.5 (2017): 051102.
Li, Wenshen, et al. "2.44 kV Ga 2 O 3 vertical trench Schottky barrier diodes with very low reverse leakage current." 2018 IEEE International Electron Devices Meeting (IEDM). IEEE, 2018.
Ma, Nan, et al. "Intrinsic electron mobility limits in β-Ga2O3." Applied Physics Letters 109.21 (2016): 212101.
Michel-Calendini, F. M., and G. Mesnard. "Band structure and optical properties of tetragonal BaTiO3." Journal of Physics C: Solid State Physics 6.10 (1973): 1709.
Ohira, S., et al. "Growth of hexagonal GaN films on the nitridated β-Ga2O3 substrates using RF-MBE." physica status solidi c 4.7 (2007): 2306-2309. Doi: 10.1002/pssc.200674877.
Sasaki, Kohei, et al. "First demonstration of Ga 2 O 3 trench MOS-type Schottky barrier diodes." IEEE Electron Device Letters 38.6 (2017): 783-785.
Silvaco—TCAD—Device Simulation "Victory Device Simulator" https://www.silvaco.com/products/tcad/device_simulation/atlas/atlas.html.
Víllora, Encarnación G., et al. "Large-size β-Ga2O3 single crystals and wafers." Journal of Crystal Growth 270.3-4 (2004): 420-426.
Wong, et al., "Current Aperture Vertical α-Ga2O3 MOSFETs Fabricated by N- and Si-Ion Implantation Doping", IEEE Electron Device Letters 40.3 (2018): 431-434.
Wong, Man Hoi, et al. "Field-plated Ga 2 O 3 MOSFETs with a breakdown voltage of over 750 V." IEEE Electron Device Letters 37.2 (2015): 212-215.
Yang, Jiancheng, et al. "High Breakdown Voltage (− 201) $\beta $-Ga2O3 Schottky Rectifiers." IEEE Electron Device Letters 38.7 (2017): 906-909.
Zetterling, C. M., Dahlquist, F., Lundberg, N., Ostling, M., Rottner, K., & Ramberg, L. (1997). High voltage silicon carbide Junction Barrier Schottky rectifiers. Proceedings of the IEEE Cornell Conference on Advanced Concepts in High Speed Semiconductor Devices and Circuits, 256-263. https://doi.org/10.1109/cornel.1997.649365.
Zhu, L., & Chow, T. P. (2008). Analytical modeling of high-voltage 4H-SiC junction barrier Schottky (JBS) rectifiers. IEEE Transactions on Electron Devices, 55(8), 1857-1863. https://doi.org/10.1109/TED.2008.926.

* cited by examiner

300

400

DIELECTRIC HETEROJUNCTION DEVICE

CROSS-REFERENCE TO RELATED APPLICATIONS

This application claims the benefit of U.S. provisional patent application No. 62/925,902, filed on Oct. 25, 2019, and entitled "DIELECTRIC HETEROJUNCTION DEVICE," the disclosure of which is expressly incorporated herein by reference in its entirety.

STATEMENT OF GOVERNMENT SUPPORT

This invention was made with government support under FA9550-18-1-0479 awarded by the Air Force Office of Scientific Research (AFOSR). The government has certain rights in the invention.

BACKGROUND

The potential of different materials for vertical power switching is often assessed by calculating the Baliga Figure of (BFOM) $((Vbr^2)/Ron=(\mu**E^3)/8$. In the case of wide and ultra-wide band gap materials, the high breakdown fields and the relatively good transport properties make the BFOM significantly higher than conventional Si electronics. However, the breakdown field predicted for a material requires that the entire band gap be presented across the rectifying junction, such as in a PN junction. This is challenging to achieve in several wide band gap materials where bipolar doping is not available or presents technological challenges. Schottky junctions can provide excellent rectification but the reverse breakdown of Schottky rectifiers is limited by the Schottky barrier height, which is significantly lower than the band gap in most wide band gap semiconductors.

It is with respect to these and other considerations that the various aspects and embodiments of the present disclosure are presented.

SUMMARY

A device is provided that comprises a first layer deposited onto a second layer. The second layer comprises a lightly doped n-type or p-type semiconductor drift layer, and the first layer comprises a high-k material with a dielectric constant that is at least two times higher than the dielectric constant of the second layer. A metal Schottky contact is formed on the first layer and a metal ohmic contact is formed on the second layer. Under a reverse bias, the dielectric constant discontinuity leads to a very low electric field in the second layer, while the electron barrier created by the first layer stays almost flat. Therefore, the device maintains a barrier to electron or hole tunneling at much higher voltages than a conventional metal/semiconductor junction. Under a forward bias, electrons flow through the first layer, into the metal ohmic contact. For small values of conduction band offset or valence band offset between the first layer and the second layer, the device is expected to support efficient electron or hole transport.

In an implementation, a device comprises: a first layer comprising a first material; a second layer comprising a second material; and a plurality of electrodes making an electrical contact to the first layer and an electrical contact to the second layer, wherein a dielectric constant of the first material is at least two times greater than a dielectric constant of the second material.

Implementations may include some or all of the following features. The second material is a semiconductor material. The electrical contact to the first layer is an anode and the electrical contact to the second layer is a cathode. The device is a current rectifying device, a photodetector, or a heterojunction. The second material is doped with a p-type or an n-type dopant. The device further comprises a metal Schottky contact formed on the first layer; and an electrical contact formed on the second layer. A conduction band offset for the first material and the second material is less than 0.5 eV. A valence band offset for the first material and the second material is less than 0.5 eV. Upon application of a forward bias, one or more carriers are transported between the first layer and the second layer. Upon application of a reverse bias, an electric field intensity in the first material is lower than an electrical field intensity in the second layer.

In an implementation, a device comprises: a first layer comprising a first material; a second layer comprising a second material having a conduction band offset or a valence band offset with respect to the first material; and a third layer comprising a third material having a n-type or p type doped semiconductor material, wherein the first material has a dielectric constant that is at least two times higher than the third material.

Implementations may include some or all of the following features. The third material is a semiconductor material. The first material comprises a drift region or drift layer. The device comprises a current rectifying device, a photodetector, or a heterojunction. The device further comprises a metal Schottky contact formed on the first layer; and an ohmic contact formed on the third layer.

In an implementation, a device comprises: a first layer comprising a plurality of plugs of a first material; a second layer comprising a second semiconductor material; and a third layer comprising a third semiconductor material, wherein a dielectric constant of the first material is at least two times greater than a dielectric constant of the second material.

Implementations may include some or all of the following features. The second material and the third material are semiconductor materials. The device further comprises a metal Schottky contact that is formed simultaneously on the first and second layers; and an ohmic contact formed on the third layer. The device comprises a current rectifying device, a photodetector, or a heterojunction. One or more carriers are transported between the first layer and the third layer when a voltage is applied to the device.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
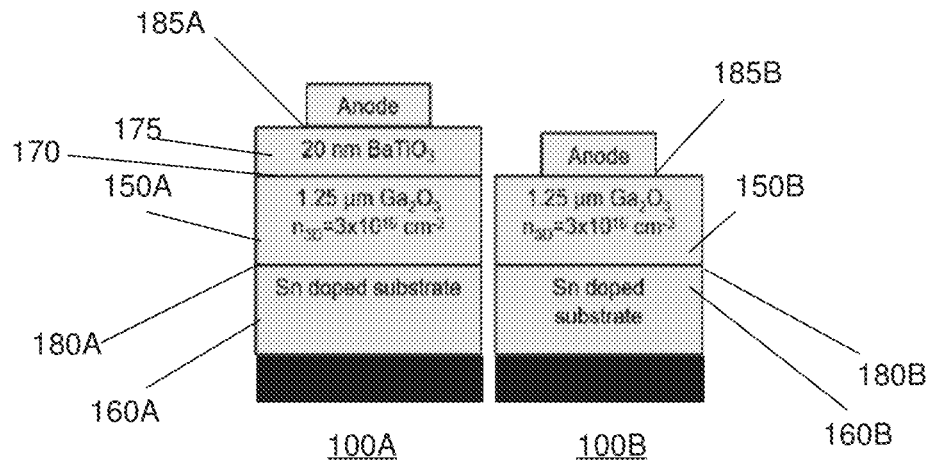
FIG. 1 is an illustration of exemplary devices.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

FIG. 1 is an illustration of example device 100A and a device 100B. The device 100B is a normal Schottky diode and the device 100A is an improved diode. As shown, the device 100A includes a first layer 175 and a second layer 150A. The device 100B includes a corresponding second layer 150B but does not include the first layer 175. Each device 100 may further include a substrate layer 160 (i.e., the substrate layers 160A and 160B). Depending on the embodiment, the device 100A may be a current rectifying device, a photodetector, or a heterojunction.

The first layer 175 of the device 100A may be constructed of a first material and the second layer 150 may be constructed of a second material. The first material may have a dielectric constant that is at least twice of the dielectric constant of the second material. The device 100A may be a high permittivity dielectric that has a minimum permittivity equal to two times that of the drift layer (i.e., the second layer 150A).

The first layer 175 may be connected to the second layer 150A by a plurality of electrodes 170. The second layer 150 may be a lightly doped material such as a doped n-type or p-type material. The first layer 175 may be high k-material with a dielectric constant that is at least twice the second layer 150. Suitable materials for the first layer 150 include $BaTiO_3$, $SrTiO_3$, and $(BaSr)TiO_3$. Other materials may be used.

In some embodiments, the first layer 175 may be an $BaTiO_3$ layer to the second layer 150. The second layer 150 may be an unintentional doped (UID) $\beta$-$Ga_2O_3$ layer.

A metal Schottky contact 185 (i.e., the contacts 185A and 185B) may be formed on the top of the high-k material (i.e., the first layer 170). An ohmic contact 180 (i.e., the contacts 180A and 180B) may be formed on the bottom of the lightly doped semiconductor layer (i.e., the second layer 150). The device 100B is a conventional Schottky diode for comparison.

In some embodiments, the 20 nm $BaTiO_3$ layer 175 may be deposited on the $\beta$-$Ga_2O_3$ of the second layer 150A by physical vapor deposition. The metal Schottky contact 185 may be a metal stack of Pt/Au (30 nm/100 nm) that is deposited on either the second layer 150 or the $BaTiO_3$ layer 175. The ohmic contact 180 may be formed by applying materials such as 30 nm Ti followed by 100 nm Au on the backside of the second layer 150.

The design principle of the device 100 is as follows. When a reverse bias is applied to the device 100B, the $\beta$-$Ga_2O_3$ Schottky barriers display reverse breakdown due to tunneling across the Schottky barrier at fields (typically ~3 MV/cm) that are significantly lower than breakdown field of $\beta$-$Ga_2O_3$ (>7 MV/cm). In the case of the device 100A, when the reverse bias is applied, the dielectric constant discontinuity (ratio ~29) leads to a very low electric field in $BaTiO_3$ (i.e., the $BaTiO_3$ layer 175). The $BaTiO_3$ electron barrier stays almost flat under reverse bias. Therefore, the $BaTiO_3$/$Ga_2O_3$ dielectric heterojunction maintains a barrier to electron tunneling at much higher voltages than the metal/semiconductor junction of the device 100B.

Under forward bias, electrons must flow from the semiconductor, through the high dielectric constant layer, into the metal. For small values of conduction band offset between $BaTiO_3$/$Ga_2O_3$ (as predicted from the electron affinity difference), dielectric heterojunction is expected to support efficient electron transport. An example conduction band offset or valence hand offset between the first layer 175 and the second layer 150 is less than 0.2 eV.

Figure 2:
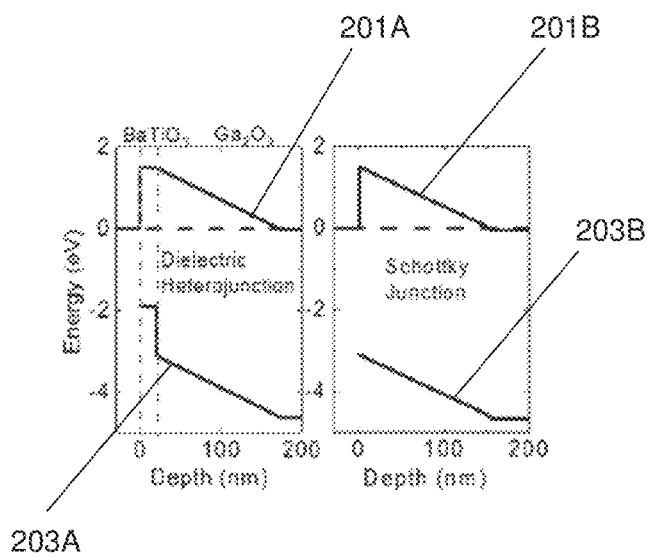
FIG. 2 is an illustration of a graph of the energy of the devices of FIG. 1.

A graph 200 of the energy of the device 100A (dielectric heterojunction) and the device 100B (Schottky junction) at different depths and biases is shown in FIG. 2. For the device 100A, the line 201A represents the energy at different depths while a reverse bias is applied, and the line 203A represents the energy at different depths while a forward bias is applied. For the device 100B, the line 201B represents the energy at different depths while a reverse bias is applied, and the line 203B represents the energy at different depths while a forward bias is applied.

Figure 3:
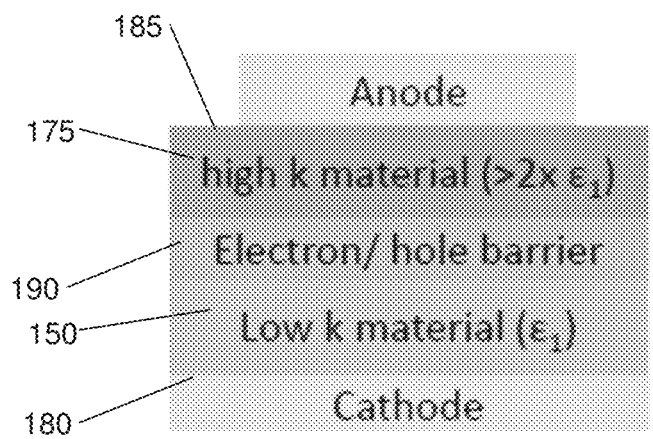
FIG. 3 is another illustration of an exemplary device.

FIG. 3 is an illustration of an example device 300. Similar to the devices 100, the device 300 includes a first layer 175, a second layer 150, a contact 180, and a contact 185. Depending on the embodiment, the device 300 may be a current rectifying device, a photodetector, or a heterojunction.

Unlike the devices 100, the device 300 may further include an electron/hole barrier 190 between the low dielectric material of the second layer 150 and the high dielectric material of the first layer 175. Suitable materials for the electron/hole barrier 190 include $SiO_2$, $Al_2O_3$, and $SiN_x$. Other material may be used.

Figure 4:
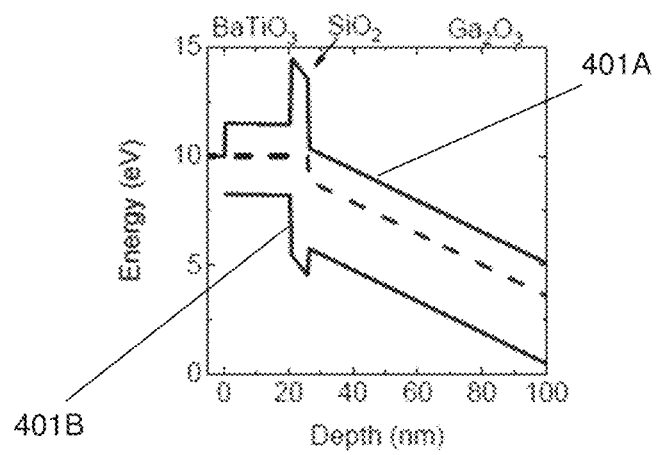
FIG. 4 is an illustration of a graph of the energy of the device of FIG. 3.

A graph 400 of the energy of the device 300 at different depths is shown in FIG. 4. The line 401A represents the energy at different depths while a reverse bias is applied to the device 300. The line 401B represents the energy at different depths while a forward bias is applied to the device 300.

Figure 5:
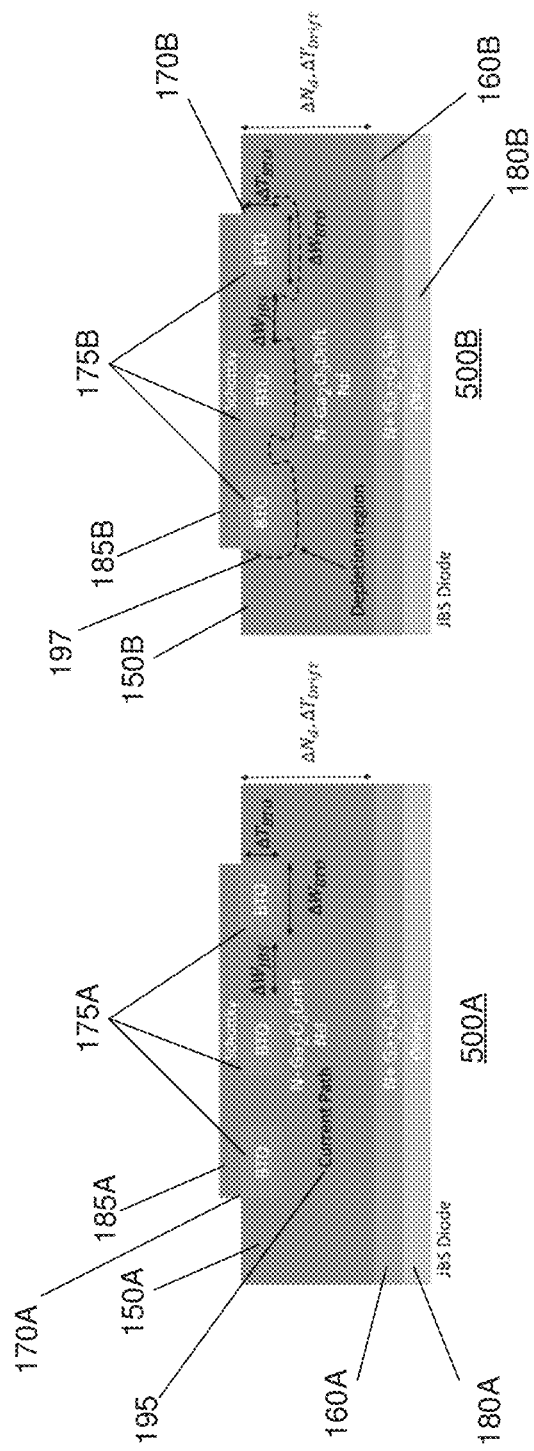
FIG. 5 is another illustration of exemplary devices.

FIG. 5 is an illustration of an example devices 500 (i.e., the devices 500A and 500B). Similar to the device 100A, the devices 500 include a first layer 175, a second layer 150, a substrate layer 160, a plurality of electrodes 170 connecting the first layer 175 to the second layer 150, a contact 180, and a contact 185. Depending on the embodiment, the devices 500 may each be a current rectifying device, a photodetector, or a heterojunction.

As shown, the devices 500 include the $BaTiO_3$ layer 175. However, rather than a continuous layer, in the devices 500 the $BaTiO_3$ layer 175 comprises a plurality of $BaTiO_3$ plugs inserted into the second layer 150. Depending on the embodiment, each $BaTiO_3$ plug may have a width (i.e., $\Delta W_{BTO}$) of approximately 2 μm, may have a depth ((i.e., $\Delta T_{BTO}$) of approximately 1 μm, and a separation distance or gap (i.e., $\Delta W_{JBS}$) of between 0.6 μm and 2.0 μm. Note that the plugs may be made of $BaTiO_3$ or any high k material.

In some embodiments, the second layer 150 (i.e., the drift region) may have a doping value (i.e., $N_d$) of approximately $1.2e16$ cm$^{-3}$, and thickness (i.e., $T_{drift}$) of approximately 6.1 μm. Other values and dimensions may be used.

The device 500A shows a current path 195 through the first layer 175A and into the second layer 150A when a forward bias current is applied. The metal/Ga$_2$O$_3$ of the second layer 150A turns on at the lower forward bias of a Schottky junction allowing current to flow through the gaps formed by the plugs of the BaTiO$_3$ layer 175.

In contrast, the device 500B shows a depletion region 197 caused when a reverse bias current is applied. The metal/Ga$_2$O$_3$ interface of the second layer 150B is shielded due to the lateral depletion of the plugs of the BaTiO$_3$ layer 175. This shielding reduces the field seen at the interface and pushes the peak electric field into the bulk of the second layer 150B.

Figure 6:
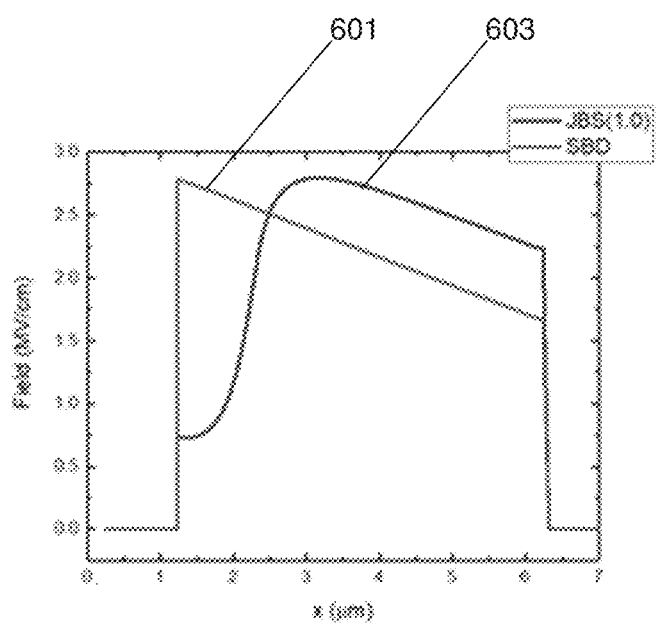
FIG. 6 is an illustration of a graph of the electrical field of the devices of FIG. 5.

FIG. 6 is a graph 600 of the electrical field versus distance for devices including the device 500. The line 601 corresponds to measured electrical field values for devices such as the device 100A or the device 300. The line 603 corresponds to the device 500. As can be seen, the plugs of the BaTiO$_3$ layer 175 push the peaks of the electrical field a further distance into the bulk of the device 500.

As used herein, the singular form "a," "an," and "the" include plural references unless the context clearly dictates otherwise.

As used herein, the terms "can," "may," "optionally," "can optionally," and "may optionally" are used interchangeably and are meant to include cases in which the condition occurs as well as cases in which the condition does not occur.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Although exemplary implementations may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
    a first layer comprising a plurality of plugs of a first material that is a high dielectric material, wherein the plurality of plugs are without metal;
    a second layer comprising a second semiconductor material; and
    a third layer comprising a third semiconductor material, wherein a dielectric constant of the first material that is the high dielectric material is at least two times greater than a dielectric constant of the second semiconductor material;
    a metal Schottky contact that is formed simultaneously on the first and second layers; and
    an ohmic contact formed on the third layer.

2. The device of claim 1, wherein the device comprises a current rectifying device, a photodetector, or a heterojunction.

3. The device of claim 1, wherein one or more carriers are transported between the first layer and the third layer when a voltage is applied to the device.

4. The device of claim 1, wherein the plurality of plugs comprises BaTiO$_3$.

5. The device of claim 1, wherein each plug of the plurality of plugs has a width of 2 μm, has a depth of 1 μm, and a separation distance of between 0.6 μm and 2.0 μm.

6. The device of claim 1, wherein the first layer comprises BaTiO$_3$.

7. The device of claim 1, wherein the second layer is a drift region.

8. The device of claim 1, wherein the second layer has a doping value of 1.2e16 cm$^{-3}$, and a thickness of 6.1 μm.

9. The device of claim 1, wherein a metal/Ga$_2$O$_3$ interface of the second layer turns on at a lower forward bias of a Schottky junction allowing current to flow through the gaps formed by the plurality of plugs of the first layer.

10. The device of claim 1, wherein a metal/Ga$_2$O$_3$ interface of the second layer is subject to a shield based on the plurality of plugs when a reverse bias current is applied.

11. The device of claim 10, wherein the shield reduces an electrical field at the metal/Ga$_2$O$_3$ interface of the second layer and pushes a peak electrical field into the second layer.

* * * * *